United States Patent [19]

Pratt et al.

[11] 4,241,132

[45] Dec. 23, 1980

[54] INSULATING BOARDS

[75] Inventors: Ralph C. Pratt, Maynard; Robert Davis, Concord; Charles P. Howland, E. Pembroke, all of Mass.

[73] Assignee: Castall Incorporated, East Weymouth, Mass.

[21] Appl. No.: 934,691

[22] Filed: Aug. 17, 1978

[51] Int. Cl.³ .............................................. B32B 15/00
[52] U.S. Cl. ................................... 428/285; 428/286; 428/290; 428/901
[58] Field of Search ............... 428/272, 285, 286, 290, 428/901, 422, 517, 519, 523; 427/96, 390 R, 404, 412, 407 R, 13

[56] References Cited

U.S. PATENT DOCUMENTS

| | | | |
|---|---|---|---|
| 2,773,781 | 12/1956 | Rodman | 428/272 |
| 3,152,949 | 10/1964 | Guthrie | 428/286 |
| 3,737,339 | 6/1973 | Alsberg | 428/901 |
| 3,783,012 | 1/1974 | Morita et al. | 427/404 |
| 3,940,534 | 2/1976 | Fick et al. | 428/901 |
| 4,092,457 | 5/1978 | Fujita et al. | 428/523 |
| 4,133,927 | 1/1979 | Tomada et al. | 428/519 |

*Primary Examiner*—Sam Silverberg
*Attorney, Agent, or Firm*—Wolf, Greenfield & Sacks

[57] ABSTRACT

An insulating board has a polymeric reinforcement layer of fibrous material with a predetermined dielectric constant. A polymer is impregnated into said reinforcement layer and has a dielectric constant which is close to that of the dielectric constant of said fibrous material and the insulating board exhibits isotropic properties. A preselected desired dielectric constant or loss tangent can be built into the board by selection of fillers to preselect the dielectric constant or loss tangent without detracting from desired mechanical properties of the board.

14 Claims, 2 Drawing Figures

INSULATING BOARDS

BACKGROUND OF THE INVENTION

Many insulating boards are known for use as printed circuit boards and other applications. Conventional printed circuit boards are often found to have different dielectric constants when measured in different directions within the board. This probably results from the need to balance desired physical properties with the dielectric constant obtainable by conventional materials used for printed circuit boards. It has long been recognized that a truly isotropic printed circuit board, that is, having substantially the same dielectric constant measurement when measured in all or any directions, would be highly desirable. This has been accomplished in some cases by the use of alumina in printed circuit boards. However, the use of alumina often results in high cost boards which are difficult to machine and brittle thus detracting from their use in many applications.

It is an object of this invention to provide a composite polymeric insulating board useful as a printed circuit base board which insulating board exhibits isotropic properties with respect to its dielectric constant and loss tangent and which can be tailored to have any one of a wide variety of preselected dielectric properties.

Still another object of this invention is to provide an insulating board in accordance with the preceding object wherein the board can have incorporated therein a reinforcement material and an impregnating polymeric material resulting in a mechanically strong yet yieldable board having good mechanical properties for use as a printed circuit board.

It is still another object of this invention to provide methods of forming insulating boards in accordance with the preceding objects.

According to the invention an insulating board has a polymeric fibrous material forming a reinforcement layer with a predetermined dielectric constant. A second polymeric material is impregnated into the reinforcement layer and has a dielectric constant closely matched to the dielectric constant of the layer and preferably within a range of ±1 of the dielectric constant of said polymeric layer of fibrous material. The overall dielectric constant of the insulating board is isotropic and preferably lies in the range of from 2.2 to 20 when measured in any or all directions at a temperature of 25° C. and at 60 cycles. Preferably the insulating board has a loss tangent in the range of from 0.0009 to 0.01 when measured at 8.5 kilomegacycles (GHz) at 23° C. and 50% relative humidity.

The loss tangent or dielectric constant can be tailored to particular applications. Preferably the polymeric fibrous material is selected from the group of polymers consisting essentially of polypropylene, polyethylene and polytetrafluoroethylene and copolymers containing a major proportion of such olefin polymers. Preferably the polymer impregnated into and formed about the reinforcement is a polybutadiene or polybutadiene copolymer with a minor percentage of other monomers which are preferably vinyl unsaturated monomers.

Either the dielectric constant or the loss tangent can be made to be different from a pure polymeric impregnating material and polymeric fibrous reinforcement containing board by the addition of fillers to the impregnating material before polymerization. However, the fillers can only be used to preselect one or the other of the dielectric constant or the loss tangent.

When variations in dielectric constant and/or loss tangent are desired, fillers can be used to make such variation. Such fillers are inert and do not enter into the exothermic reaction during curing of the impregnated polymer about the fibrous material.

It is a feature of this invention that a wide range of dielectric constants and/or loss tangents can be obtained in an insulating board having good mechanical properties permitting a multitude of uses for the boards of this invention. The isotropic properties with regard to both the dielectric constant and loss tangent are extremely important when the insulating boards are used as bases for antennas or for conventional printed circuit base boards.

BRIEF DESCRIPTION OF THE DRAWINGS

The above and other objects, features and advantages of the present invention will be better understood from the following description when read in conjunction with the accompanying drawings in which.

DESCRIPTION OF PREFERRED EMBODIMENTS

Figure 1:
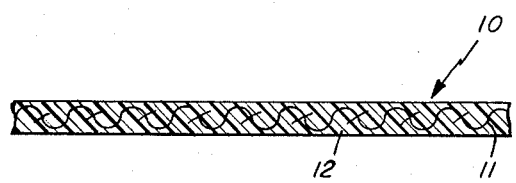
FIG. 1 is a cross sectional view through an insulating board in accordance with the present invention.

With reference now to the drawings, an insulating board in accordance with the present invention is illustrated at 10 in FIG. 1 and has a fibrous reinforcement layer 11 impregnated with a thermoset polymeric material 12.

Figure 2:
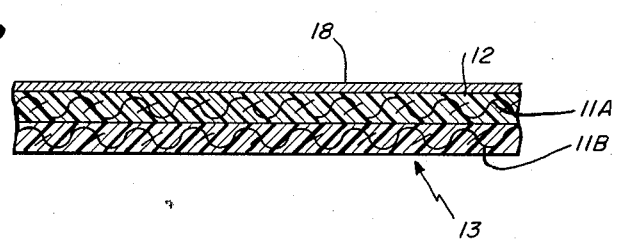
FIG. 2 is a cross sectional view through a modification thereof showing a copper outer layer for use as a circuit element of a printed circuit.

The overall length and width of the board can vary greatly depending upon the particular usage to which it is to be put as is known in the art. Similarly the thickness of the board can vary depending upon its particular usage. For example, the board can be made in thicknesses of from 0.004 inch to 1 inch or more. For most applications the board has a thickness of 0.05 to 0.1 inch. When thicknesses above 0.05 inch are required, it is preferred to use composite boards such as shown in FIG. 2 at 13 where two fibrous layers 11a and 11b are used with the impregnant 12 being as previously described. Obviously any number of fibrous layers can be used with additional impregnant material to increase thickness as desired. The boards can have copper, aluminum or other metal layers such as copper layer 18 formed or later adhered to them or alternately the board can be formed directly on a preformed metal sheet. The boards can be processed into circuit carrying bases by known techniques including etching, masking, etc.

The fibrous material which acts as a reinforcement is preferably a non-woven, polypropylene fibrous material. In some cases, woven materials or chopped fibrous reinforcement materials can be used as the fibrous reinforcement. The fibers are preferably substantially uniformly distributed throughout the completed boards. other olefins such as polyethylene and polytetrafluoroethylene or copolymers of these olefins with other materials and with each other can be used in fiber forms. Polypropylene is preferred since it gives the desired mechanical strength, has a dielectric constant within a range of interest which can be closely matched by the impregnating polymer. It is a key feature of this invention that the impregnant have when polymerized and cured, a dielectric constant closely matched to that of the reinforcement. Preferably the dielectric constants of the two are within a range of ±1 of each other and in the case of polybutadiene and polypropylene are within 0.7 at 23° C. and 60 cycles.

In a preferred embodiment, the fibrous reinforcement is a non-woven textile such as Pelon, a trademarked product of the Pelon Corporation of Lowell, Massachusetts, consisting essentially of a polypropylene batting with a thickness of from 0.002 inch to 0.025 inch. Pelon N1251F having a weight of 30 grams per meter$^2$ with a thickness of about 0.009 inch and a breaking strength of 5 pounds with an elongation of 22% and a wicking rate in 30% KOH (SECS/1 inch), of 40 seconds/inch is a particularly desirable material.

The impregnating polymer to which the dielectric constant of the Pelon is matched is a polybutadiene which may be filled and which may comprise polybutadiene polymerized alone or along with other monomers and preferably vinyl unsaturated monomers.

High vinyl 1-2 liquid polybutadienes are preferred for use as the impregnated polymer such as Ricon 150 a trade name product of Colorado Chemical Specialties of Golden, Colorado, consisting essentially of polybutadiene which has a microstructure of 70±5% 1,2 vinyl, a molecular weight average of about 2,050±200 and which is a viscous clear liquid with a viscosity as measured in a Brookfield Viscometer at 23° C. in CPS at 40,000±10,000 and a specific gravity of 0.89 with a bulk density of about 7.4 lbs/gallon and an intrinsic viscosity of 0.105±0.06. Other polybutadienes can also be used. These polybutadienes are preferably finally cured or polymerized after impregnation into the reinforcing material.

The polybutadiene formulations can have comonomers introduced therein such as vinyl unsaturated monomers including but not limited to styrene, vinyl toluene, t-butyl styrene, alphamethylstyrene, monochlorostyrene, isobutylmethacrylate, methylmethacrylate, diallyl maleate, diallyphthalate. Preferably substantially pure polybutadiene is used and in all cases the polybutadiene is at least 50% by weight of any final copolymers. Known cross-linkers are preferably included to shorten curing times although in some cases they can be eliminated. Peroxide curing or curing induced by other conventional methods such as irradiation can be used. Cross-linking agents include but are not limited to divinyl benzene, trimethylolpropane trimethacrylate and 1,3 butylene dimethacrylate. Organic peroxide catalysts as known in the art can also be used in curing. Such catalysts include benzoyl peroxide, methyl ethyl ketone peroxide, di-t-butyl-peroxide and a,a'-bis (t-butyl-peroxy) diisopropylbenzene.

Small amounts of other compounding agents can be used to induce curing as known in the art. In all cases, the final product is a thermoset polybutadiene polymeric material.

It is important to maintain physical properties in the finally cured product as well as maintaining isotropic properties as to loss tangent and dielectric constant over a wide range of operating frequencies and other conditions. The desirable physical properties include high strength, some small degree of flexibility, good support for conventional printed circuit and antenna materials and other known desirable physical properties of printed circuit boards.

Since in some cases it is desirable to tailor the dielectric constant and/or loss tangent, various fillers can be used to provide tailoring. Preferred fillers include polyethylene, polytetrafluoroethylene, alumina, barium titanate, titanium dioxide, and strontium titanate. Other fillers can be used. The fillers are used to raise the dielectric constant in an amount necessary to balance the properties of the materials in the overall board. The fillers can also be used to adjust the loss tangent of the materials. Normally one can design a board of this invention to meet a predetermined dielectric constant value or a predetermined loss tangent value by selection of the amount and particular filler used. However, it is usually not possible to preselect both values by addition of a filler. Thus either loss tangent or dielectric constant to be set is selected and filler added to obtain that value in the amount required as known in the art and whatever value results for the other value not designed for is accepted. In all cases the fillers are inert during the chemical reaction to cure the impregnant about the reinforcing material. The fillers are preferably in particle form of less than micron size and never more than 95% weight of the total composition.

Generally the insulating boards of this invention are prepared by mixing together the monomeric butadiene of low polymers of butadiene with the catalyst and one or more comonomers if used. Similarly if filler is used, that is premixed with the monomer. Homogeneous distribution of the ingredients is preferred. A reinforcing polymeric fabric material is then selected and cut to size. The monomeric mixture of resin and catalyst is then poured onto the reinforcing material to thoroughly soak it. If more than one layer of reinforcement is to be used, plural layers are stacked until the desired number of layers and desired thickness is obtained. Generally one reinforcing layer of 0.007 inch thickness for each 0.010 finish thickness is used. The soaked reinforced layer or layers are then placed in an evacuation chamber to remove all air and to insure complete wetting of the reinforcing fibrous layer. The impregnated fibrous layer is then placed in a press at 275° F. to 300° F. and pressed to remove air and allow the resin to cure for time periods of from preferably 30 minutes to 2 hours. The completed molded material is in a thermoset form, is substantially homogeneous and exhibits isotropic properties as to dielectric constant values and loss tangent values.

The following non-limiting specific examples are provided as illustrative of the invention:

EXAMPLE 1

One hundred grams of Ricon 150 are homogeneously admixed with a catalyst obtained from Lucidol Corporation under the trade name Lupersol 101 which is a peroxide catalyst having a boiling point at 119° C. and known to be useful for high temperature curing of polybutadiene. The mixture is made and then 30 grams of it is poured over each of three 10" long by 10" wide sheets of Pelon having a thickness of 0.008" each and comprising 8.34 grams. After thorough soaking, the sheets are stacked, placed in an air evacuation chamber to remove all air and to assure complete wet out of the fabric. The impregnated fabric is then placed in a press at room temperature and the press is brought down to stops so as to produce a 0.025" thick finished product. The product is maintained in the press for one hour at 285° F. to produce a final insulating board having a dielectric constant of 2.3 at 8.5 GHz and 23° C. The loss tangent of the material is 0.002 at 8.5 GHz and 23° C. The material exhibits good mechanical properties for use as a printed circuit board. That is, it has some flexibility yet is resistant to temperatures of up to at least 275° F. while maintaining its physical properties. The board is a thermoset composite material that exhibits isotropic properties as to loss tangent and dielectric constant.

EXAMPLE 2

Example 1 is repeated; however, 56 grams of the Ricon Lupersol mixture is further admixed with 144 grams of strontium titanate in powder form to form a uniform mixture. 140 grams of this mixture is then impregnated into four sheets of Pelon as previously described which is then molded and cured as described in Example 1 to form a final product having a thickness of 0.040 inches. The dielectric constant of this material at 8.5 GHz and 23° C. is 10 and a loss tangent of about 0.0032 at 8.5 GHZ and 23° C.

EXAMPLE 3

Example 1 is repeated; however, 40 grams of the Ricon and Lupersol mixture is further admixed with 160 grams of strontium titanate. 150 grams of this mixture is then impregnated into three sheets of Pelon 1251F. The three sheets of Pelon are disposed above each other and cured in the mold as previously described. The final product exhibits a dielectric constant of 16 at 8.6 GHz and 23° C. and a loss tangent of about 0.0029 at 8.5 GHz and 23° C.

EXAMPLE 4

Example 2 is repeated except that 155 grams of barium titanate ($BaTiO_3$) is substituted for the 144 grams of strontium titanate. An insulating board results having good mechanical properties with a dielectric constant of 10 at 8.5 GHz and 23° C. and a loss tangent of about 0.008 at 8.5 GHz and 23° C.

In all of the above examples, the dielectric constant and loss tangent of the resulting material are isotropic.

When any one of the formulations of Examples 1-4 are formed by placing the impregnated sheets on a copper layer, the impregnating polymeric material polymerizes and adheres to the copper forming an integrally printed circuit board suitable for etching of circuitry as shown in FIG. 2 of the drawing.

While specific examples of the present invention have been shown and described, many variations are possible. In all cases it is necessary to match the resin, fiber and particulate filler to give the desired dielectric constant and/or loss tangent of the resulting board. Both the impregnating thermoset material and the reinforcement layer must have a dielectric constant under 3 and a loss tangent of less than 0.002 at operating temperatures such as for example 60 cycles per second and 23° C. In all cases the final board also has a dielectric constant of less than 3 unless the impregnating polymeric material is filled and is capable of withstanding sustained operating temperatures of at least 135° C. without melting. The reinforcement layer of polyolefin is preferably a non-woven fibrous material which swells or otherwise is distributed uniformly throughout the board from top to bottom surfaces thereof to give homogeneity to the insulating board. Mats of Pelon or like materials are preferred because the fibers swell and give substantially homogeneous distribution. Such fibers often have lengths of at least $\frac{1}{8}$ inch and diameters of less than 0.001 inch although these dimensions may vary.

The dielectric constant and loss tangent values of any particular material can of course vary somewhat with the frequency at which it is measured. The values given are for the frequencies and temperatures of operation of use. In many cases the variation is minor as for example the polypropylene reinforcing mat has a dielectric constant of 2.2 at 60 cycles, $10^3$ cycles and at $10^6$ cycles while its loss tangent - tan $\delta$ is about 0.0005 at 60 cycles, 0.0008 at $10^3$ cycles and 0.0018 at $10^6$ cycles. Polybutadiene which has a dielectric constant when measured at 23° C. and 60 cycles of about 2.9, 2.78 at $10^6$ and 2.9 at $10^{10}$ has a loss tangent - tan $\delta$ at 60 cycles of 0.0001, at $10^6$ 0.0029, and at $10^{10}$ 0.004. These materials when combined in the present invention give an overall insulating board dielectric constant of 2.315 at $10^{10}$ and a loss tangent of 0.0015.

Preferably the polymeric impregnating material comprises from 70 to 98% by weight of the binder to reinforcing material total and the reinforcing material comprises from 2 to 30% by weight. The insulating boards can have thicknesses of from 0.005 inch and up but in most cases will be less than one inch thick.

We claim:

1. An insulating board, said board having a reinforcement polymeric layer of fibrous material with a predetermined dielectric constant and loss tangent suitable for use as a printed circuit base board with said dielectric constant being within the range of from 2.2 to 20, a polybutadiene thermoset polymer impregnated into said reinforcement layer and having a dielectric constant which is closely matched to the dielectric constant of said layer, said insulating board having a dielectric constant which is isotropic and a loss tangent which is isotropic, said polymeric fibrous material being a polyolefin material, said dielectric constant of said polybutadiene polymer and said reinforcement layer each being below 3 at 60 cycles and 23° C.

2. An insulating board in accordance with claim 1 and further comprising the material of said reinforcement layer being selected from the class consisting of polypropylene, polyethylene, polytetrafluoroethylene and copolymers thereof.

3. An insulating board in accordance with claim 1 and further comprising, said polybutadiene carrying a filler therein which filler is inert to the curing of said polybutadiene.

4. An insulating board in accordance with claim 3 and further comprising said polybutadiene being a copolymer of polybutadiene and a minor percentage of an unsaturated vinyl monomer.

5. An insulating board in accordance with claim 1 wherien said board has a loss tangent value in the range of from 0.0009 to 0.01 at 8.5 GHz and 23° C.

6. An insulating board in accordance with any one of claims 1-5 wherein said polybutadiene carries uniformly distributed therein an inert filler which acts to modify the dielectric properties of said insulating board without destroying the isotropic properties of said board.

7. An insulating board in accordance with any one of claims 2-5 wherein a layer of copper overlies said board.

8. An insulated board in accordance with claim 6 wherein a layer of copper overlies said board.

9. An insulating board, said board having a reinforcement layer of polymeric fibrous material with the polymeric fibrous material being selected from the class consisting of polypropylene, polyethylene, polytetrafluoroethylene and copolymers thereof,
    a polybutadiene thermoset polymeric material impregnated into said reinforcement layer to form a substantially homogeneous board with the dielectric constant of said polybutadiene material being in a range of ±1 of the dielectric constant of said fibrous material,
    said insulating board having a dielectric constant which is isotropic and a loss tangent which is isotropic.

10. An insulating board in accordance with claim 9 and further comprising an inert filler uniformly distributed therein and selected to modify a dielectric property of said board.

11. An insulating board in accordance with claim 10 wherein said filler is selected from the class consisting essentially of polyethylene, polytetrafluoroethylene, alumina, barium titanate, titanium dioxide, and strontium titanate.

12. An insulating board in accordance with claim 11 and further comprising said reinforcement layer being formed of polypropylene fibers.

13. An insulating board in accordance with claim 9 wherein said polybutadiene material comprises from 70 to 98% by weight of the board and said board has a dielectric constant in the range of from 2.2 to 20.

14. An insulating board in accordance with claim 9 wherein said board has a loss tangent in the range of from 0.0009 to 0.01.

* * * * *

UNITED STATES PATENT AND TRADEMARK OFFICE
CERTIFICATE OF CORRECTION

PATENT NO. : 4,241,132
DATED : December 23, 1980
INVENTOR(S) : Ralph C. Pratt, et al It is certified that error appears in the above—identified patent and that said Letters Patent is hereby corrected as shown below:

Claim 5; second line, correct "wherien" to read --wherein--.

Claim 7; second line, change "2-5" to read --1-5--.

Claim 8, line 1, correct "insulated" to read --insulating--.

Signed and Sealed this

Fifteenth Day of September 1981

[SEAL]

Attest:

Attesting Officer

GERALD J. MOSSINGHOFF
Commissioner of Patents and Trademarks